(12) United States Patent
Hatase (10) Patent No.: US 6,348,947 B1
(45) Date of Patent: Feb. 19, 2002

(54) IMAGE SCANNER

(75) Inventor: Takayuki Hatase, Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 08/597,035

(22) Filed: Feb. 5, 1996

(30) Foreign Application Priority Data

Feb. 7, 1995 (JP) .............................................. 7-019341

(51) Int. Cl.[7] .................................................. H04N 3/14
(52) U.S. Cl. ........................................ 348/312; 348/135
(58) Field of Search ................................. 348/135, 136, 348/137, 138, 142, 87, 92, 94, 95, 311, 312, 317, 324, 126; 359/474, 482, 483; 358/474, 473, 449, 479, 494

(56) References Cited

U.S. PATENT DOCUMENTS 4,641,183 A * 2/1987 Kinoshita ..................... 358/44
5,033,102 A * 7/1991 Nakajima et al. ............. 382/48
5,262,871 A * 11/1993 Wilder et al. .......... 358/213.11

FOREIGN PATENT DOCUMENTS

JP    405037861    * 2/1993    .......... H04N/5/335

* cited by examiner

Primary Examiner—Wendy P. Garber
Assistant Examiner—Christopher Onuaku
(74) Attorney, Agent, or Firm—Stevens, Davis, Miller & Mosher, LLP (57) ABSTRACT

An image scanner capable of reducing the read time by narrowing the visual field for a small-size electronic component. This image scanner includes a photosensitive element array having a plurality of photosensitive elements arranged in a row which are exposed to light to accumulate charges therein, a shift register for receiving the charges stored in the photosensitive elements and supplying the charges to an output portion, a shift gate for controlling the charges stored in the photosensitive elements to be transferred to the shift register, and a transfer command signal output portion for generating a transfer command signal by which the charges stored in the photosensitive elements are allowed to be transferred to the shift register. In addition, the transfer command signal output portion is able to change the intervals of time at which the transfer command signal is generated.

10 Claims, 11 Drawing Sheets

IMAGE SCANNER

BACKGROUND OF THE INVENTION

1. Field of the Invention

This invention relates to an image scanner designed for high-speed image scanning.

2. Description of the Related Art

In most of the present electronic-parts mounting systems, before the electronic components picked up from the parts feeder are mounted on an object such as a board or leadframe, they are observed by a scanner, and their positional deviations from ideal positions are detected by an image processor and then corrected. As this image scanner, there are two types, one of which reads a whole image in a two-dimensional way, and the other one of which reads the whole image in a one-dimensional way in a primary scanning direction perpendicular to the movement of an electronic component and accumulates the read one-dimensional images in a secondary scanning direction to form a two-dimensional image. This invention employs the latter type.

Figure 12:
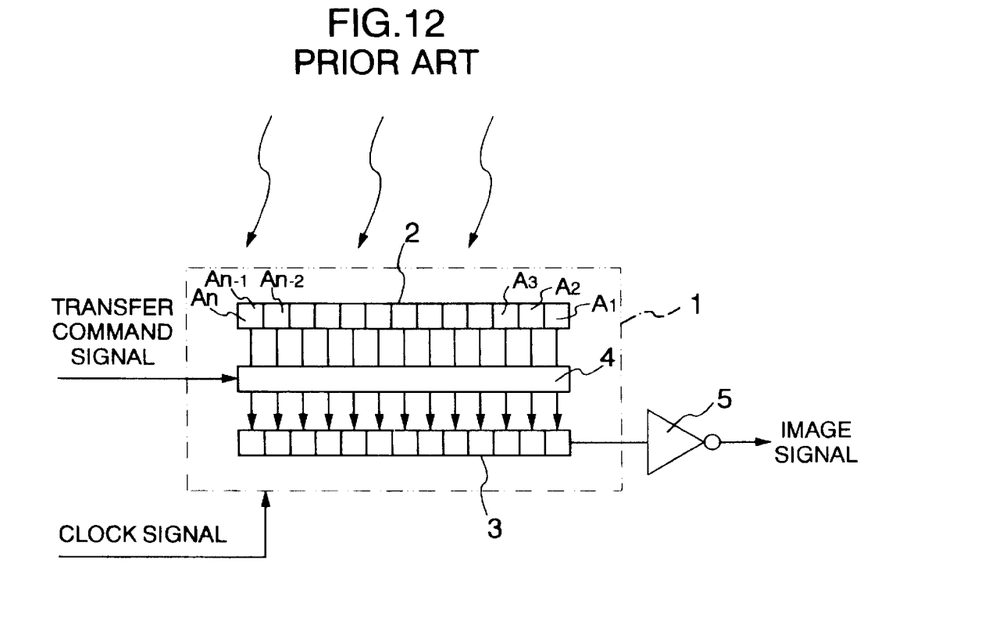
FIGS. 12–13 are diagrams for explaining the operation of the one-dimensional CCD camera.
Figure 13:
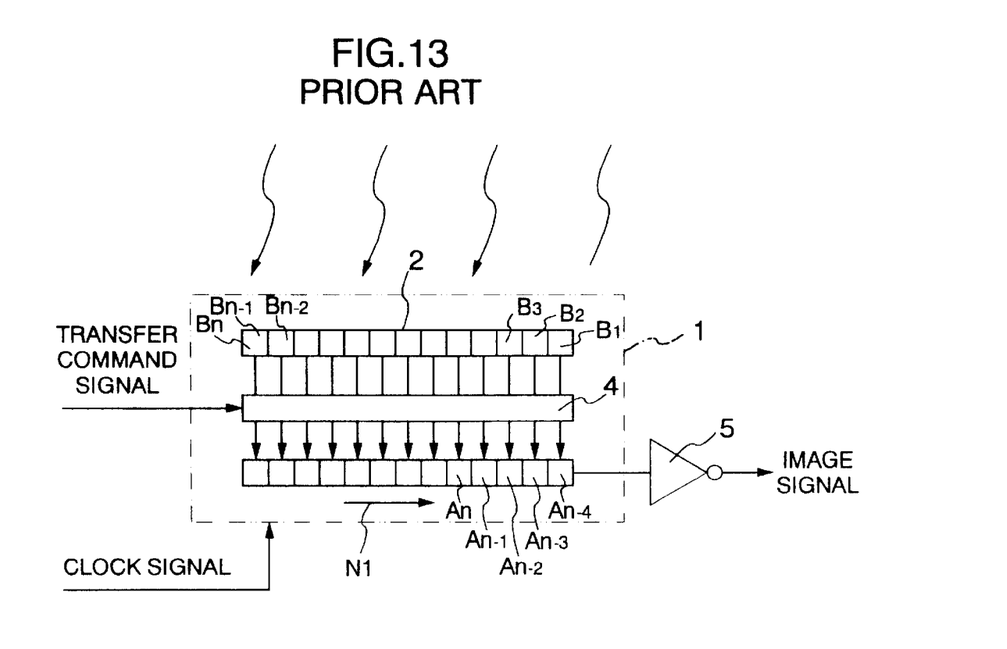

The principle on which a one-dimensional CCD camera operates will be described before we mention the drawbacks of the prior art. FIGS. 12 and 13 are diagrams for use in explaining the operation of the one-dimensional CCD camera. In FIG. 12, reference numeral 1 represents a one-dimensional CCD camera. The one-dimensional CCD camera 1 has an photosensitive element array 2 which is formed of photosensitive elements for storing charges according to the intensity of received light. These photosensitive elements are arranged in a line from one end to the other end of the photosensitive element array 2. The camera 1 also has a shift register 3 formed of elements facing the photosensitive elements one to one and receiving the charges transferred at a time from the photosensitive element array 2, and a shift gate 4 which permits or inhibits the transfer of the charges from the photosensitive element array 2 to the shift register 3. The shift gate 4 normally inhibits the transfer, and during this time the charges are stored in the respective photosensitive elements. When a transfer command signal is supplied to the shift gate 4, the charges of the photosensitive elements are simultaneously transferred to the corresponding elements of the shift register 3. The charges transferred to the shift register 3 are sequentially taken out, starting from the charge of the photosensitive element of the one end, as an image signal through an output portion 5 in synchronism with a clock signal.

Here, it is assumed that when the charges in the photosensitive elements of the array 2 are represented by $A_1$, $A_2, \ldots, A_{n-1}, A_n$, the transfer command signal is supplied to the shift gate 4. At this time, the charges $A_1, A_2, \ldots, A_{n-1}$, $A_n$ are transferred to the shift register 3 at a time, and then the image signal is sequentially output in synchronism with the clock signal as indicated by an arrow N1 in FIG. 13. If the transfer command signal is supplied to the shift gate 4 before the image signal is completely produced as shown in FIG. 13, the charges remaining in the elements of the shift register 3 on the output portion 5 side are mixed with those transferred from the photosensitive element array 2, and as a result an error signal is produced. Specifically, as shown in FIG. 13, new charges $B_1, B_2, \ldots, B_{n-1}, B_n$ are already accumulated in the photosensitive elements of the array 2, and if the shift gate 4 permits the transfer, the charges $A_n, \ldots, A_{n-4}$ will be mixed with charges $B_5, \ldots, B_1$, respectively. Therefore, the transfer command signal cannot be supplied to the shift gate 4 until all the charges of the shift register 3 are completely sent to the outside. This means that the read time depends on the number of elements of the shift register 3, that is, the number of photosensitive elements of the array 2.

Figure 14:
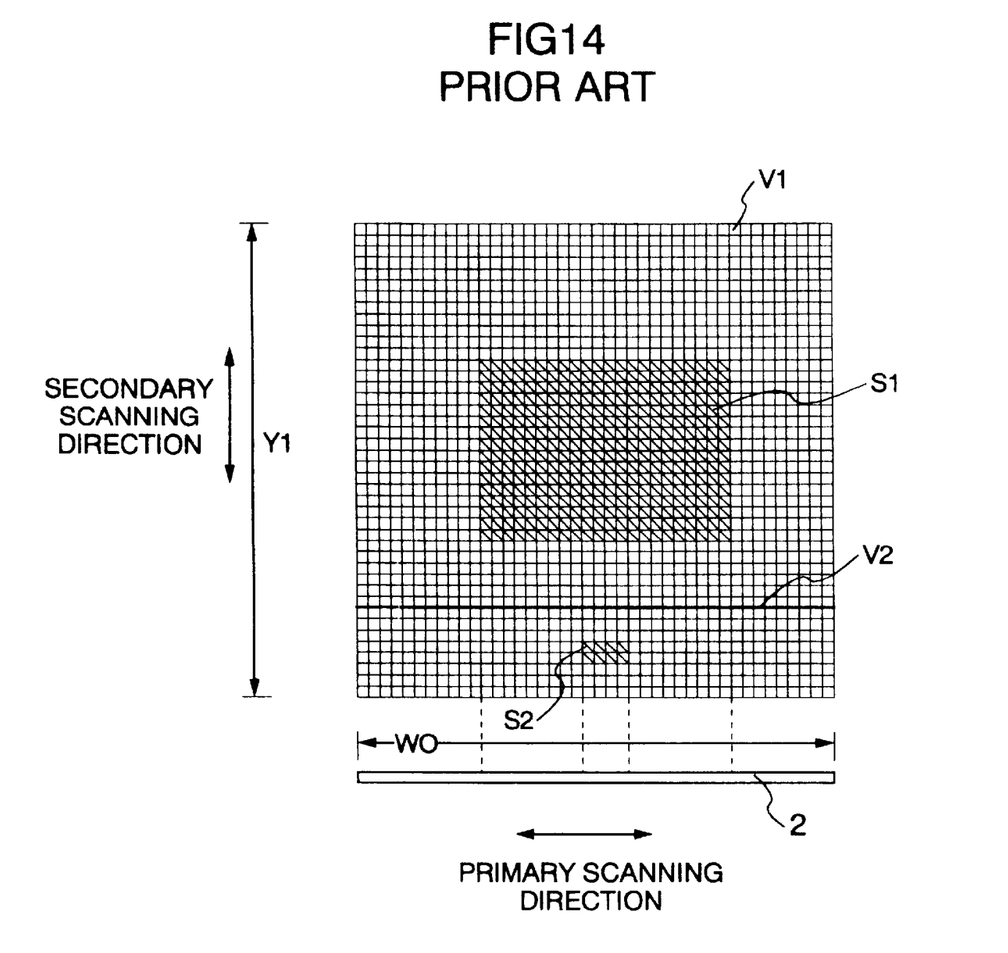
FIG. 14 is a diagram for explaining the relation between electronic components and a visual field to be fixed in the conventional image scanner.

FIG. 14 is a diagram for use in explaining the relation between a visual field to be fixed and electronic components in a conventional image scanner. In FIG. 14, a symbol S1 represents an image of a large-size component, for example, a large QFP (quadrilateral flat package), and S2 an image of a small-size component, for example, a rectangular chip. As illustrated in FIG. 14, the length W0 of the photosensitive element array 2 is selected to be very large so that even if the large-size component is somewhat deviated in position, the edges of the component never stick out from the visual field V1. For the above reason, it takes a long time to read the line in the primary scanning direction. Therefore, the conventional image scanner has the drawback that it cannot operate at high speed since it takes a long time to read the image signal.

SUMMARY OF THE INVENTION

It is an object of the present invention to provide an image scanner and method of image scanning capable of high-speed scanning by reducing the image reading time when the image of a small-size electronic component is scanned.

According to the present invention, there is provided an image scanner including a photosensitive array having a plurality of photosensitive elements arranged in a row from one end to the other end which are exposed to light from an object to accumulate a plurality of charges therein, a shift gate for receiving the plurality of charges stored in the plurality of photosensitive elements and simultaneously transferring the plurality of charges in accordance with a transfer command signal, a shift register for receiving the plurality of charges simultaneously transferred from the shift gate, and sequentially supplying the plurality of charges one by one, starting from the charge stored in the photosensitive element of the one end, and transfer command signal output means for supplying the transfer command signal to the shift gate, the output means being constructed to be able to change the intervals of time at which the transfer command signal is supplied.

Moreover, according to the present invention, there is provided an image scanning method for reading an image by a photosensitive element array which has a plurality of photosensitive elements arranged from one end to the other end, including the steps of blocking a certain number of photosensitive elements of the plurality of photosensitive elements sequentially arranged starting from the other end of the photosensitive element array so that charges cannot be accumulated in the certain number of photosensitive elements, exposing the other ones of the plurality of photosensitive elements to light so that charges can be accumulated in the other photosensitive elements, simultaneously transferring a plurality of charges stored in the other photosensitive elements to a shift register, sequentially supplying the plurality of transferred charges from the shift register one by one starting from the charge stored in the photosensitive element of the one end, and simultaneously transferring new charges accumulated in the other photosensitive elements to the shift register after all the plurality of charges are completely fed from the shift register.

According to the present invention, an interval of time, at which the transfer command output means outputs the transfer command signal, can be changed in accordance with the size of an object to be imaged, such as an electronic component, that is, the size of an image to be obtained.

Therefore, when the image of a small-size object to be imaged is scanned or read out, the output interval of the transfer command signal can be reduced and the image can be fast read out. When the image of a large-size object is read out, the output interval of the transfer command signal can be extended and the visual field can be widened.

DESCRIPTION OF THE PREFERRED EMBODIMENTS

Some embodiments of the present invention will be described with reference to the accompanying drawings. The embodiments are examples of the application of the image scanner of the present invention to the electronic-parts mounting system.

Figure 1:
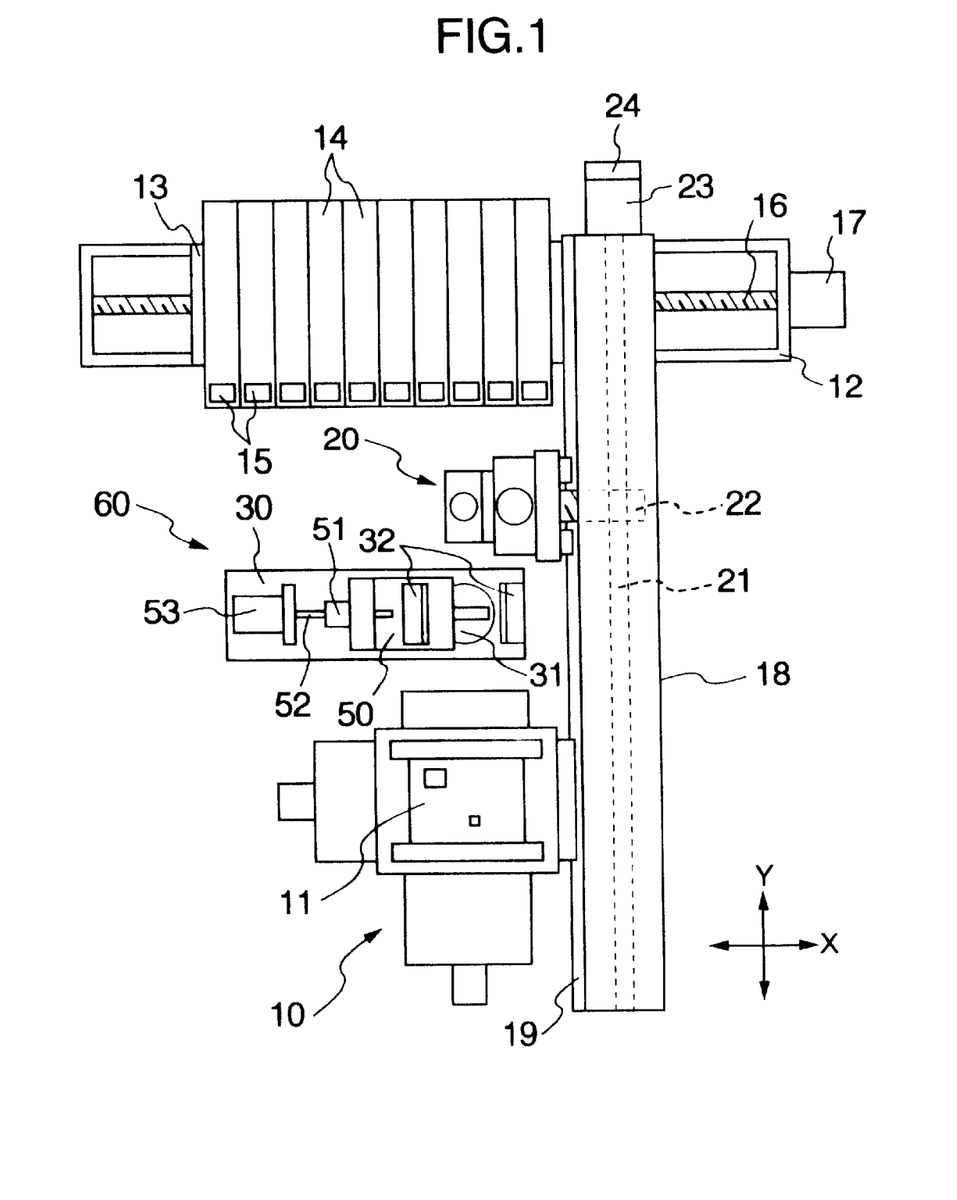
FIG. 1 is a plan view of an electronic-parts mounting system having an image scanner according to the first embodiment of the present invention.
Figure 2:
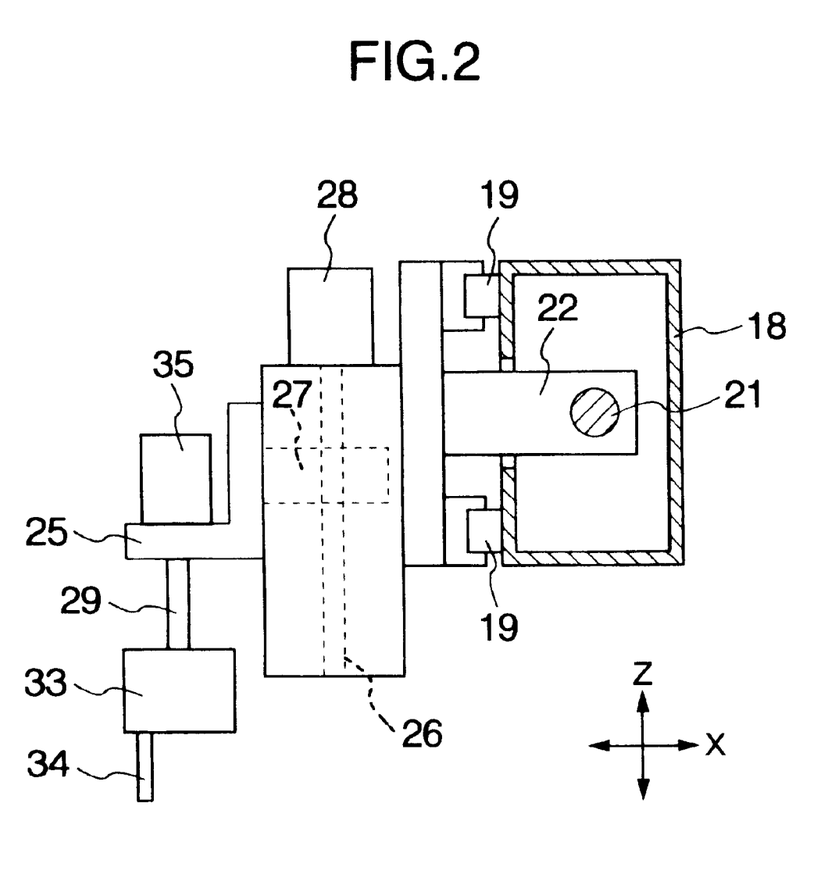
FIG. 2 is a side view of a mounting head of the mounting system having the image scanner according to the first embodiment of the present invention.
Figure 3:
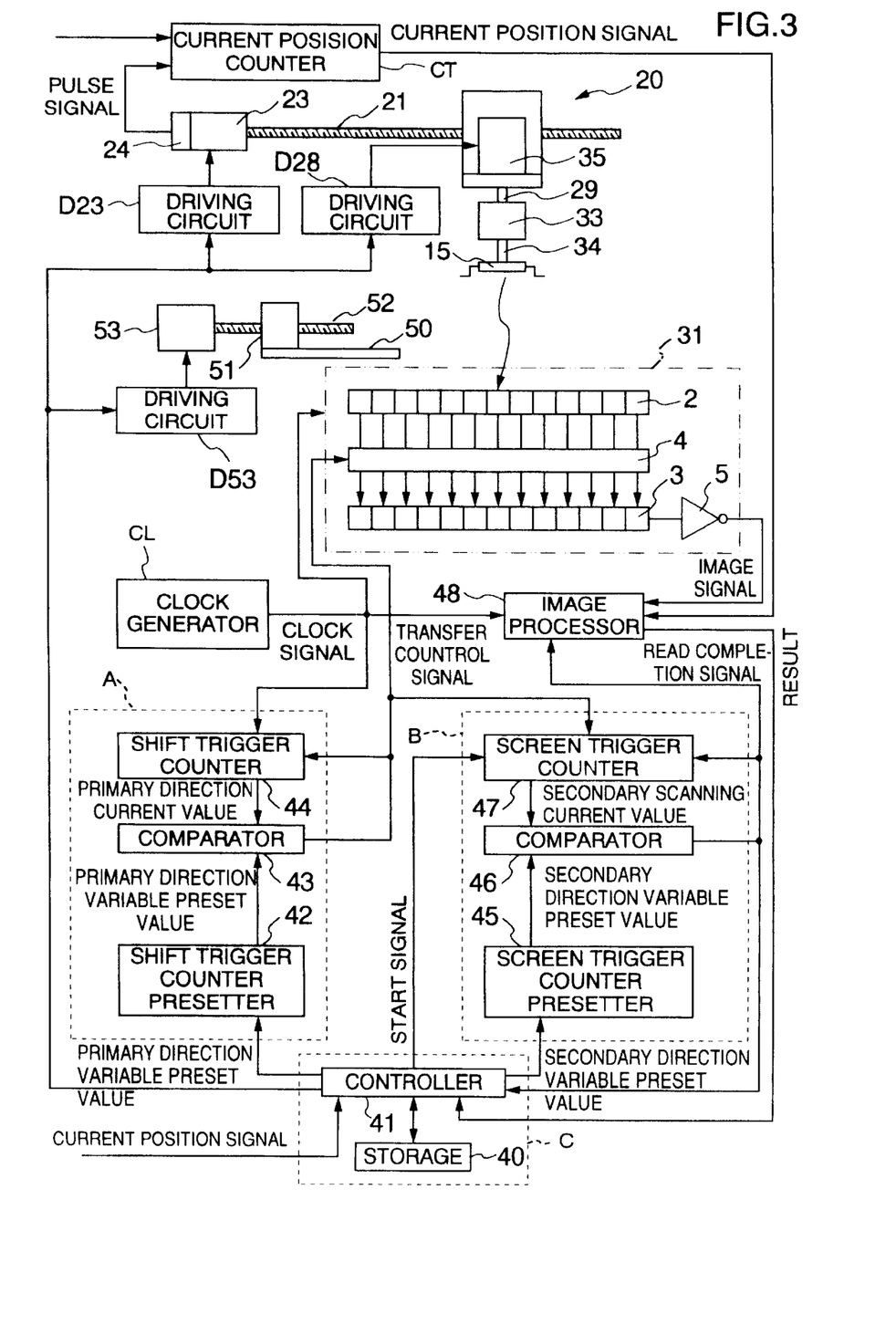
FIG. 3 is a block diagram of the electronic-parts mounting system having the image scanner according to the first embodiment of the present invention.

FIG. 1 is a plan view of the electronic-parts mounting system having the image scanner according to the first embodiment of the present invention. FIG. 2 is a side view of the mounting head of the mounting system having the image scanner according to the first embodiment of the present invention. FIG. 3 is a block diagram of the mounting system having the image scanner according to the first embodiment of the present invention. FIG. 4 through FIG. 8 are diagrams for explaining the visual field of the image scanner according to the first embodiment of the present invention. In these figures, like elements corresponding to those in FIGS. 12 through 14 are identified by the same reference numerals and will not be described.

Referring to FIG. 1, there are shown an XY table 10 which serves as positioning means for positioning a board 11 on which electronic components are to be mounted, a base table 12 provided distant from the XY table 10, a supply table 13 which is placed on the base table 12 to be slidable in the X-direction, and a part feeder group 14 which is placed on the supply table 13 and which supplies electronic components 15 of various kinds and of various sizes. In addition, there are shown a ball screw 16 which is long in the X-direction and which is mounted to be rotatable at its opposite ends on the base table 12, and a motor 17 for rotating the ball screw 16 to thereby move the supply table. Though not shown, a ball nut is fixed on the under side of the supply table 13 and engages with the ball screw 16 so that when the motor 17 drives to rotate the screw, the supply table 13 can be moved in the X-direction.

Moreover, a reference numeral 18 is a mounting head table which is long in the Y-direction and provided as moving means fixed to the base table 12, a numeral 19 is a guide which is in parallel with and fixed on the left side of the mounting head table 18 in FIG. 1, and a numeral 20 is a mounting head which is guided to slide along the guide 19. Also, a numeral 21 is a ball screw which is provided within the mounting head table 18 and fixed at its opposite ends to be rotatable. The ball screw 21 is engaged with a ball nut 22 that is fixed to the mounting head 20 so that when the ball screw 21 is rotated by a mounting head moving motor 23, the mounting head can be moved in the Y-direction, that is, between the part feeder 14 and the board 11. The motor 23 is driven by a driving circuit D23 shown in FIG. 3, so that the mounting head 20 can be moved at a constant low speed over the top of an image scanner 60 and at a high speed over the other areas. In addition, the rotating state of the motor 23 is sensed by an encoder 24, and the pulse signal from the encoder 24 is counted by a current position counter CT shown in FIG. 3, so that the current position of the mounting head 20 can be known.

The image scanner 60 will be described below. Reference numeral 30 designates a recognition box disposed between the part feeder 14 and the board 11. The recognition box 30 includes a one-dimensional CCD camera 31 for observing upward the electronic component 15 held by the mounting head 20 on the moving pass. Light sources 32 are provided on both sides of the camera 31 and irradiate light to the electronic component 15. The construction of the one-dimensional CCD camera 31 itself is the same as in FIG. 12.

The left one of the light sources 32 in FIG. 1 is mounted on a shading plate 50 of an L-letter shape that is provided to be movable in the X-direction on the recognition box 30. In addition, a ball nut 51 is fixed at the back end of the shading plate 50, and engaged with a ball screw 52 which is supported on the recognition box 30 at its ends to be rotatable. A motor 53 is provided to rotate the ball screw 52 thereby moving the shading plate. When the motor 53 is driven by a driving circuit D53 shown in FIG. 3, the shading plate 50 can be stuck out to close the front of the camera 31 or withdrawn to open it. Therefore, the camera 31 is partially shaded or not in the primary scanning direction (coincident with the X-direction) so that the effective visual field of the camera 31 in the primary scanning direction can be expanded or contracted. In this embodiment, when the shading plate 50 is moved from left to right, the photosensitive elements of the array 2 of the camera 31 are shaded in the order of left to right elements by taking the right end of the array 2 in FIG. 1 as a reference point. In other words, the visual field of the camera 31 in the primary scanning direction is, as it were, shifted to the right near the output portion 5. As described later, the electronic components 15 are set to pass as near to the right end of the camera 31 in FIG. 1 as possible so that the useless visual field on the left side can be made as wide as possible.

The construction of the mounting head 20 will be described in detail with reference to FIG. 2. Referring to FIG. 2, there are shown a lift frame 25 supported to move up and down, a perpendicular ball screw 26, a ball nut 27 engaged with the ball screw 26 and fixed to the lift frame 25, a Z-direction motor 28 for rotating the ball screw 26, a perpendicular θ-angle shaft 29 supported at its ends by the lift frame 25 to be rotatable, a head body 33 having a nozzle 34 provided at the lower end to suck the electronic component 15 and integrally mounted to the θ-angle shaft 29, and a θ-angle motor 35 for horizontally rotating the θ-angle shaft 29. Thus, when the Z-direction motor 28 is driven by a driving circuit D28 as shown in FIG. 3, the electronic component 15 supported by the nozzle 34 can be moved down and near to the recognition box 30. When the θ-angle motor 35 is driven, the electronic component 15 can be rotated in the θ-angle direction to be corrected for its posture. The nozzle 34 is mounted to be eccentric to the θ-angle shaft 29.

The electronic-parts mounting system using the image scanner according to this embodiment will be described with reference to FIG. 3. Referring to FIG. 3, there is shown a primary scanning direction processor A. This processor A generates the transfer command signal for permitting the transfer and supplies it to the shift gate 4. The processor A also measures an elapsed time ranging from the start of generation of the transfer command signal to the present time on the basis of the clock signal generated from a clock generator circuit CL, and compares it with a variable preset value for primary scanning direction which value is supplied from control means C. If the elapsed time coincides with the variable preset value, the processor A supplies the next transfer command signal to the shift gate 4. In other words, this primary scanning direction processor A controls an interval of time at which the transfer command signal is output to the shift gate 4 of the one-dimensional CCD camera 31. Thus, this processor may be called a transfer command output means.

The main scanning direction processor A includes a shift trigger counter presetter 42 in which the variable preset value for primary scanning direction is set by a controller 41, a comparator 43 and a shift trigger counter 44 which is reset by the transfer command signal generated from the comparator 43 and which up-counts the clock signal and supplies the current value for primary scanning direction to the comparator 43. The comparator 43 compares the variable preset value for primary scanning direction fed from the shift trigger counter presetter 42 and the current value for primary scanning direction fed from counter 44. If those values coincide with each other, the comparator 43 supplies the transfer command signal to the shift gate 4 so as to open the shift gate 4. In other words, the primary scanning processor serves as the transfer command signal output means. At the same time as the transfer command signal is supplied to the shift gate, it is also supplied to a screen trigger counter 47 of a secondary scanning direction processor B.

The secondary scanning direction processor B compares the number of times (the current value for secondary scanning direction) that the primary scanning direction processor A supplies the transfer command signal and a variable preset value for secondary scanning direction which corresponds to the length of visual field for secondary scanning direction, which is perpendicular to the primary scanning direction and parallel to the direction in which the electronic component 15 is moved, in an image developed by an image processor 48. If the current value equals to the variable preset value, the secondary scanning direction processor supplies a read completion signal to the image processor 48. In other words, the secondary scanning direction processor B can change an extent of the secondary scanning direction visual field in the image developed by the image processor 48 in accordance with the variable preset value.

The secondary scanning direction processor B includes a screen trigger counter presetter 45 in which the variable preset value fed from the controller 41 is set, a comparator 46 and a screen trigger counter 47 which is reset by the read completion signal fed from the comparator 46 and which up-counts the transfer command signal and generates the current value for secondary scanning direction. The comparator 46 compares the variable preset value fed from the counter presetter 45 and the current value fed from the screen trigger counter 47. If those values coincide with each other, the comparator 46 supplies the read completion signal to the controller 41, the image processor 48 and the screen trigger counter 47, and resets the screen trigger counter 47.

The control means C controls the whole electronic-parts mounting system. That is, it controls the driving circuits D23, D28 to cause the electronic component 15 to move as described above, and supplies to the primary scanning direction processor A the variable preset value corresponding to the effective length of visual field for primary scanning direction according to the size of the electronic component 15 sucked by the nozzle 34. In addition, it supplies to the driving circuit D53 a signal indicating the fore end of the shading plate 50 and controls the number of photosensitive elements to be shaded of the array 2. Moreover, the control means C supplies a start signal to the secondary scanning direction processor B when the head 20 with the electronic component 15 sucked approaches to the upper side of the recognition box 30 and is changed in its moving speed from a high value to a constant low value. The image processor 48, when receiving the read completion signal, processes the read image signal and supplies the result to the control means C. In this case, the image processor 48 may detect the presence or absence of the electronic component 15, the positional deviation thereof or other factors in the image processing operation. The read completion signal is also fed to the control means C. When receiving the read completion signal, the control means C orders the driving circuit D23 to change the speed of the head moving motor 23 from the constant low state to the high state.

The control means C includes a storage portion 40 having a memory for storing the kind and size of the electronic component sucked by the nozzle 34 and for storing the variable preset values for primary and secondary scanning directions which are properly selected in accordance with the size, and the controller 41 which receives various signals and generates control signals with reference to the data in the storage portion 40.

Figure 4:
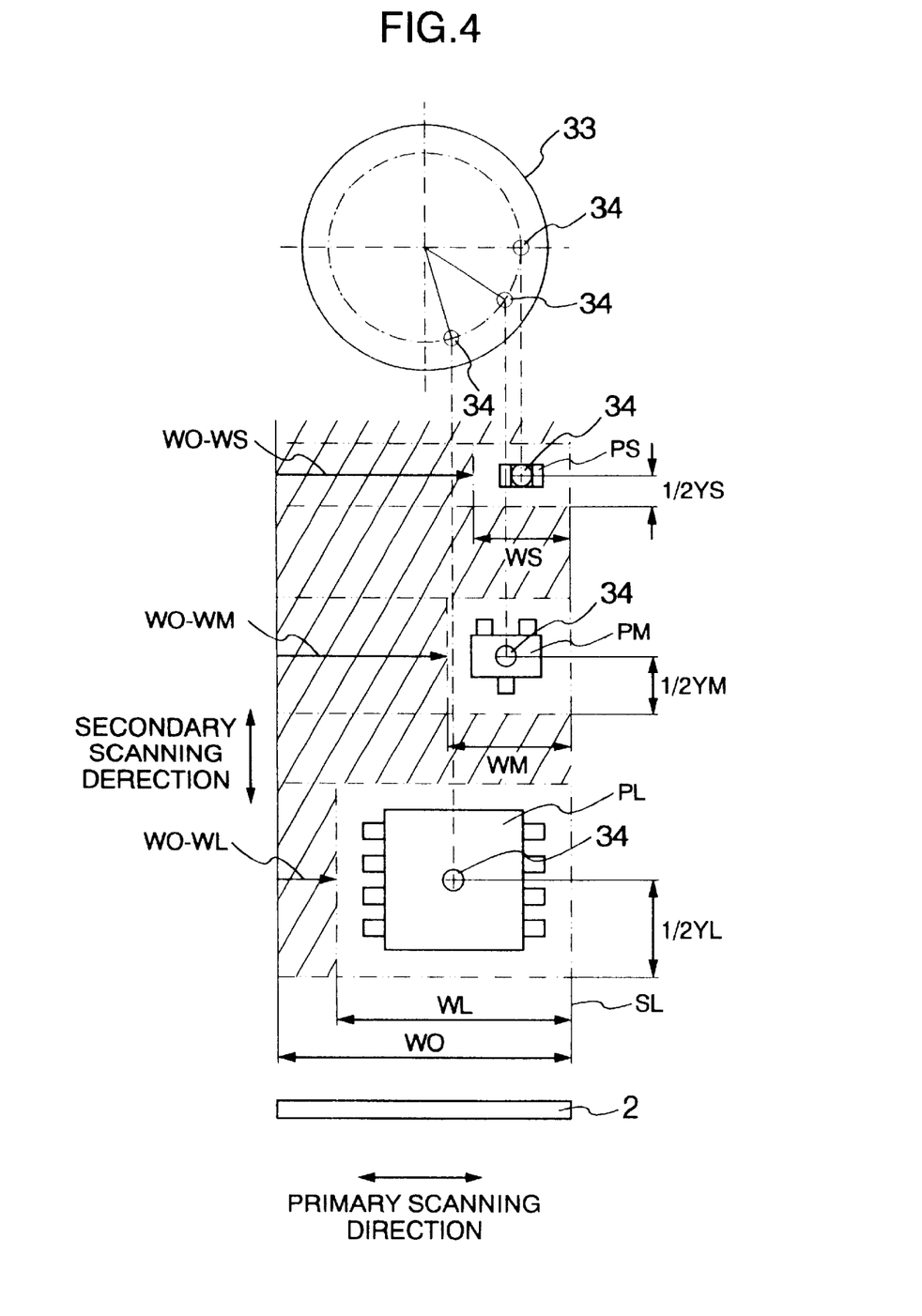
FIGS. 4–8 are diagrams for explaining the visual field of the image scanner according to the first embodiment of the present invention.

The operation of the electronic-parts mounting system having the image scanner 60 according to the first embodiment will be described with reference to FIG. 4. In this operation, a large-size electronic component PL, a medium-size electronic component PM and a small-size electronic component PS are sequentially mounted on the board 11. Here, the length of the array 2 in the primary scanning direction is represented by WO. On the basis of the known data of sizes. PL, PM and PS of electronic components, the following effective visual fields, which are the rectangular areas indicated by chain lines in FIG. 4 and definitely determined by the preset values for primary and secondary scanning directions, can be established. The effective visual fields have the primary scanning preset values (the lengths WL, WM and WS indicated by the number of photosensitive elements) somewhat longer the sizes of components PL, PM and PS in the primary scanning direction, and the secondary scanning preset values (the lengths YL, YM and YS indicated by the number of lines of array 2) slightly longer than those in the secondary scanning direction. Thus, the shape of each rectangular area can be specified. Also, in the first embodiment, since the effective visual field is shifted right to the output portion 5 side of the one-dimensional CCD camera 31, the right side of each rectangular region is made coincident with the right end of the array 2 as shown in FIG. 4. In addition, the nozzle 34 sucks each electronic component PL, PM, PS in order that the center of the nozzle coincides with the center of each component, and the nozzle 34 is previously moved in the θ-angle direction by the θ-angle motor 35 so that the center of the nozzle 34 comes to the position of WL/2 for component PL, WM/2 for component PM, and WS/2 for component PS from the reference line SL. Thus, the nozzle 34 can be brought to the center of each rectangular region of effective visual field, and the component PL, PM, PS sucked by the nozzle 34 can be located at the center of each rectangular area.

Figure 5:
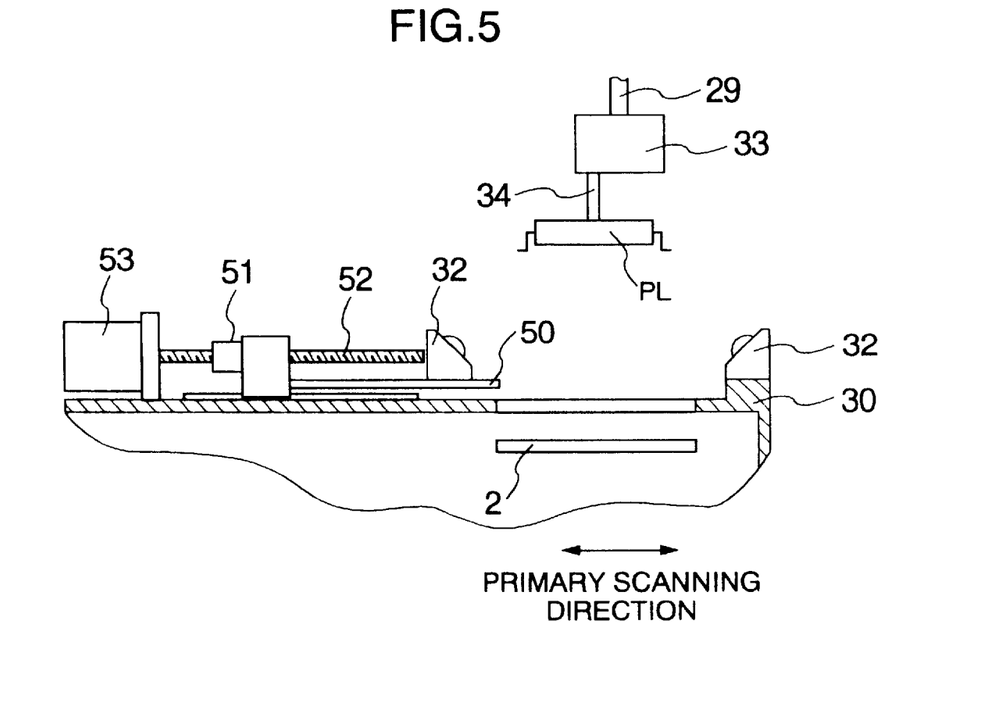

FIG. 5 shows the large-size electronic component PL passing over the photosensitive element array 2. At this time, as shown in FIG. 4 at the lower portion, the useless visual field in the primary scanning direction is just a small area. Therefore, the shading plate moving motor 53 is driven to move the shading plate 50 to the left in FIG. 5, making almost all the top of the array 2 open. In addition, as described above, the nozzle 34 is swung to pass substantially over the center of the array 2 by the θ-angle motor 35.

Figure 6:
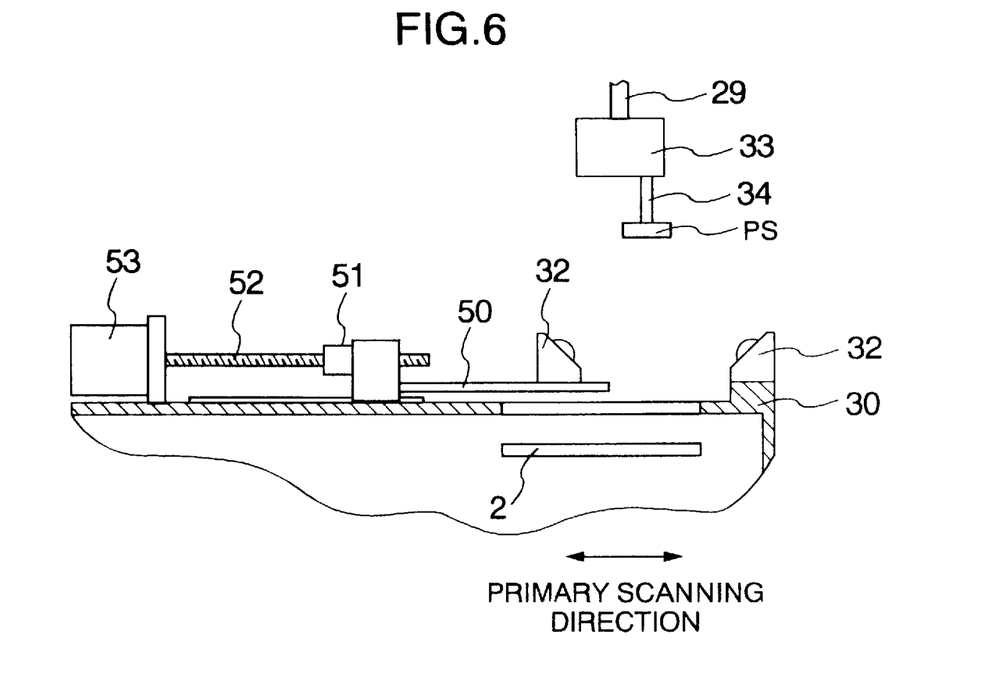

FIG. 6 shows the small-size electronic component PS passing over the array 2. At this time, as shown in FIG. 4 at the upper portion, the effective visual field in the primary scanning direction is narrow, and thus the shading plate 50 is moved by the motor 53 to close almost all the top of the array 2. Under this condition, the left portion of the array 2 in FIG. 6 is not exposed to light so that no charge is accumulated.

Figure 7:
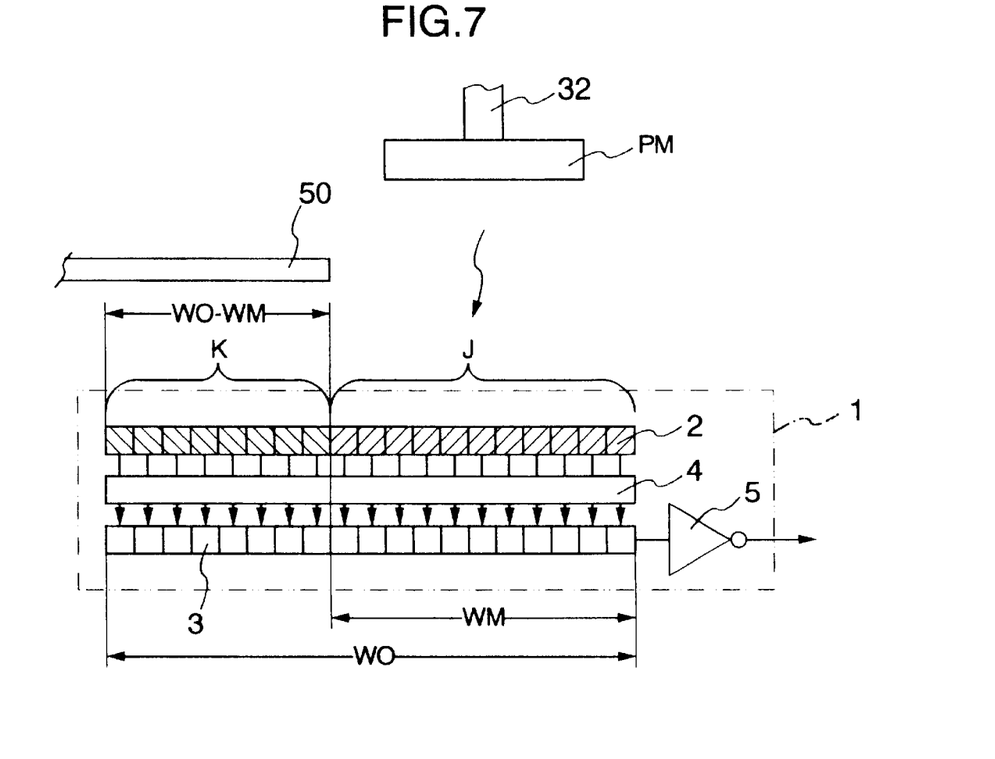
Figure 8:
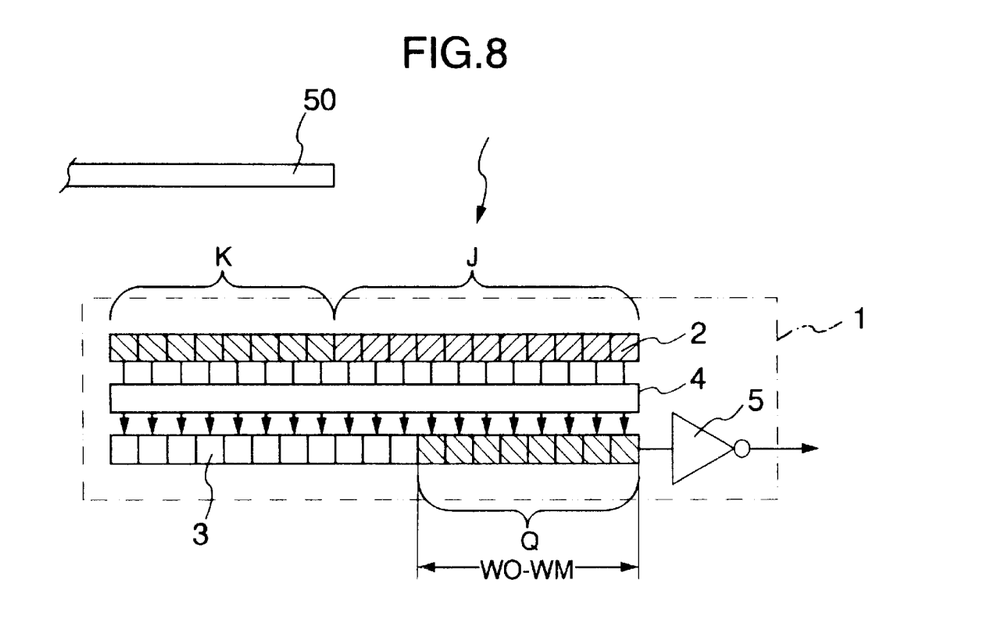

FIGS. 7 and 8 show the data output produced when the medium-size electronic component PM is sucked by the nozzle 34 and when the left portion of the array 2 is closed by the shading plate 52. In FIGS. 7 and 8, a symbol J represents the effective photosensitive elements which can be exposed to light, and K the useless photosensitive elements which are closed by the shading plate 50 so that they cannot be exposed to light. The shading plate 50 is adjusted in its position in order to close the top of the useless photosensitive elements K that are sequentially connected over the length (WO-WM) from the left end of the array 2. Under this condition, when the electronic component PM passes over the array 2, charges indicating the image data of this component PM are accumulated in the effective photosensitive elements J, whereas no charge is stored in the useless photosensitive elements K, and therefore, these elements K are in the initial state. The stored charges in the effective photosensitive elements J are transferred to the shift register 3 and fed to the output portion 5 faster than in the useless elements. As illustrated in FIG. 8, when the charges stored in the effective elements J are completely fed to the output portion, only the charges of the useless photosensitive elements K remain in the shift register 3. However, since the charges remaining in the shift register 3 are the initial value, no data mixture occurs even if new charges are again accumulated in the effective photosensitive elements J and transferred to the shift register 3 under this condition. Accordingly, immediately after the charges in the effective photosensitive elements J have been completely fed to the output portion from the shift register 3, the shift register 3 can receive the next charges, with the result that the shift gate 4 can be opened at short intervals of time to increase the speed of reading the image of the component PM. In the first embodiment, the primary scanning preset value to be supplied from the controller 41 to the shift trigger counter presetter 42 in FIG. 3 is changed within the range from the maximum WO to the minimum WO-WM in accordance with the size of the image or visual field in the primary scanning direction, thereby changing the timing for opening the shift gate 4, that is, the timing of the transfer command signal which is supplied from the comparator 43 to the shift gate 4.

Figure 9:
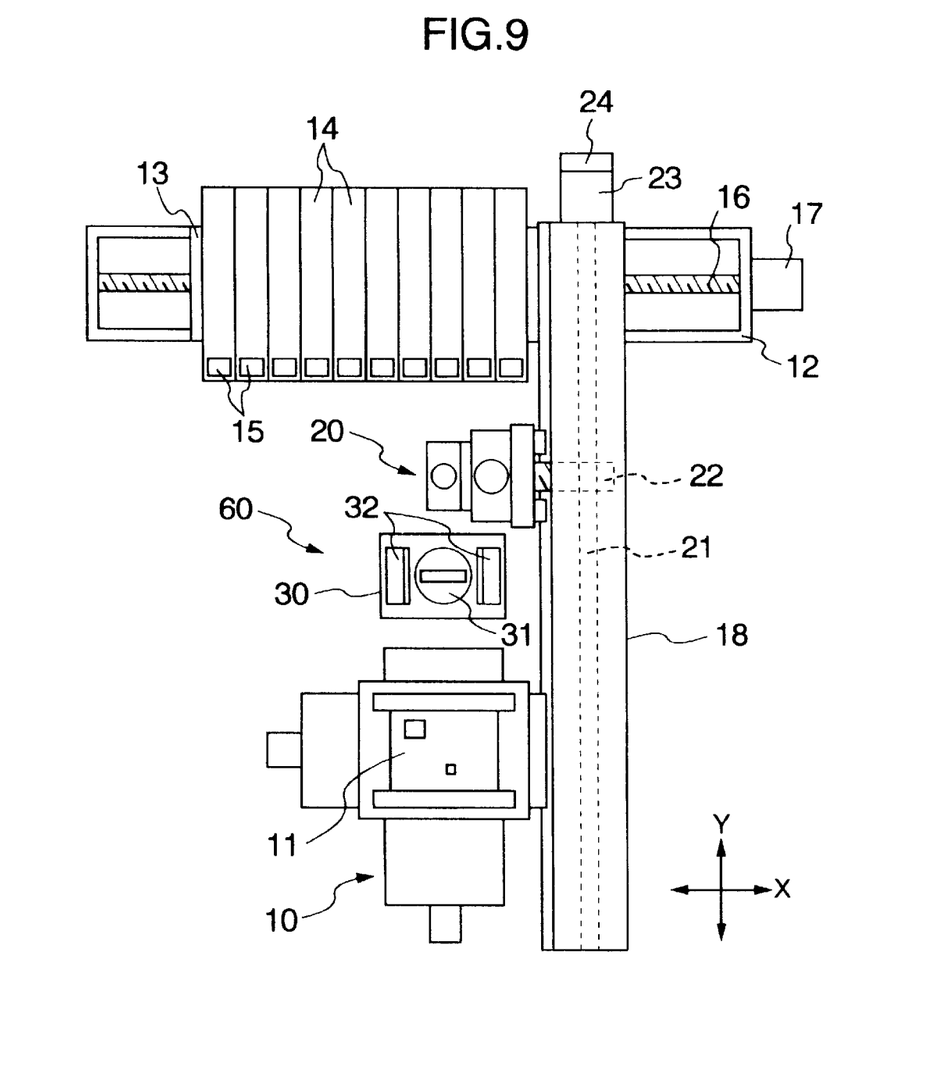
FIG. 9 is a plan view of an electronic-parts mounting system having an image scanner according to the second embodiment of the present invention.
Figure 10:
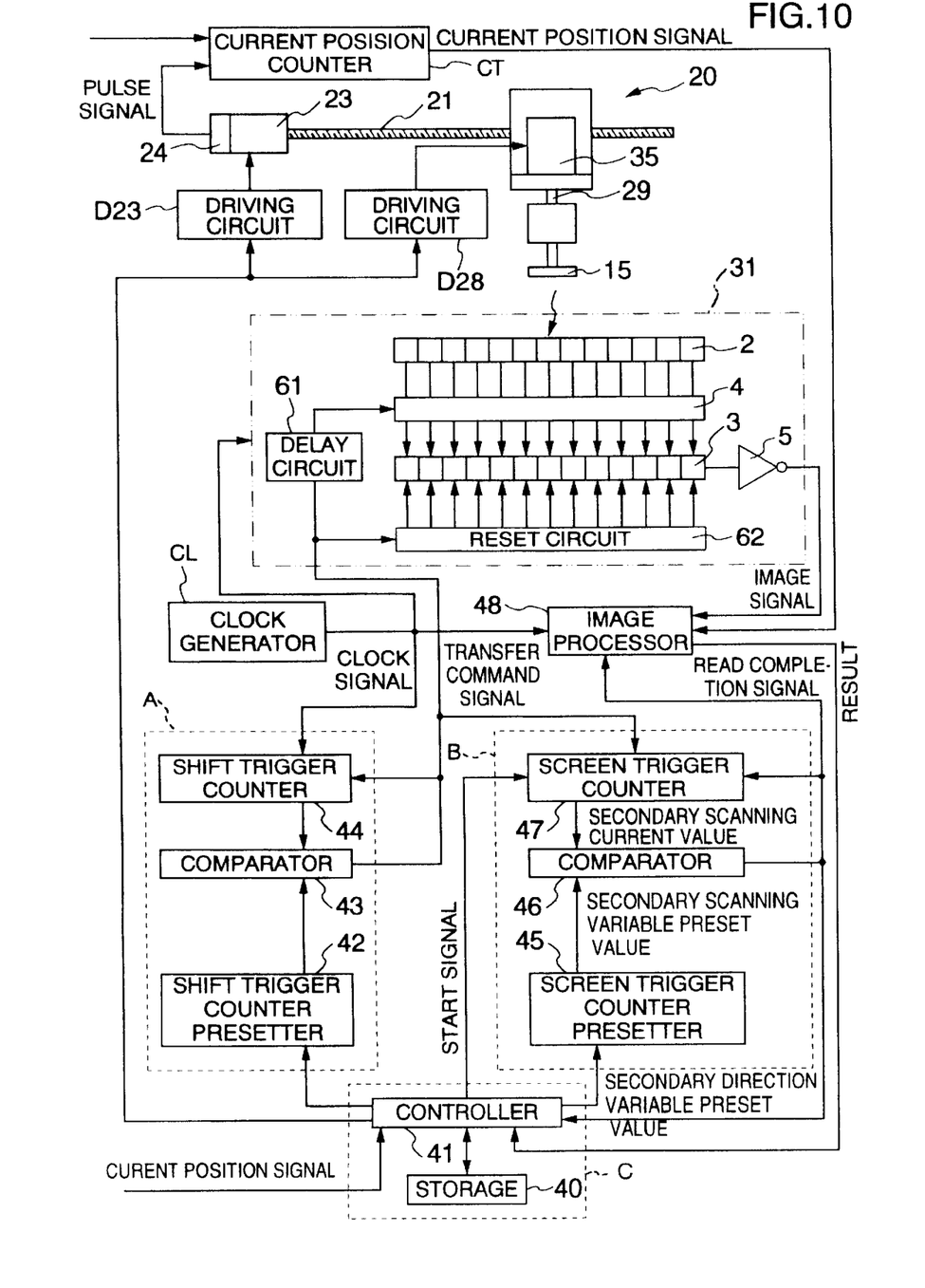
FIG. 10 is a block diagram of the mounting system having the image scanner according to the second embodiment of the present invention.

FIG. 9 is a plan view of an electronic-parts mounting system having the image scanner according to the second embodiment of the invention. FIG. 10 is a block diagram of the electronic-parts mounting system having the image scanner according to the second embodiment of the invention. The second embodiment is different from the first embodiment in that the shading plate for mechanically shading the array 2 is replaced by a delay circuit 61 and a reset circuit 62. The reset circuit 62 resets the shift register 3 about the charges stored therein into the initial value. The reset circuit 62 is actuated by the transfer command signal supplied from the primary scanning direction processor A. The delay circuit 61 delays the transfer command signal fed from the primary scanning direction processor A by the amount enough for the reset circuit 62 to reset the shift register 3, and then supplies the delayed signal to the shift gate 4. Therefore, before the shift gate 4 is opened, allowing the charges of the array 2 to be transferred to the shift register 3, the charges remaining in the shift register 3 can be previously reset to be the initial value.

In the second embodiment, the useless photosensitive elements K are also exposed to light so that charges are accumulated therein, and the accumulated charges are transferred to the shift register 3. However, after the charges in the effective photosensitive elements J are completely supplied to the output portion 5, the transfer command signal is fed and the shift register is reset by the reset circuit 62. Therefore, even though new charges are accumulated in the array 2 and transferred to the shift register 3, no charge mixture occurs. The other operations are the same as in the first embodiment, and hence will not be described.

Figure 11:
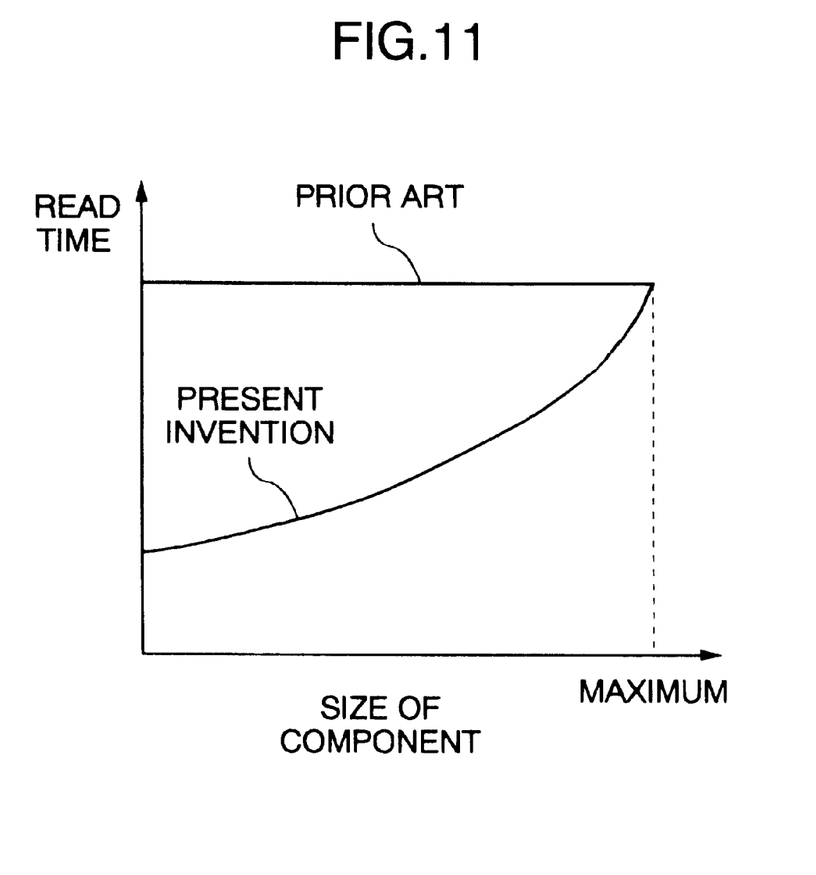
FIG. 11 is a graph showing the relation between the size of electronic components and read time in the image scanner according to the present invention.

FIG. 11 is a graph showing the relation between the size of electronic components and the read time in the image scanner according to the present invention. In both first and second embodiments of the invention, if the size of the electronic component is smaller, the preset values for primary and secondary scanning directions are reduced to make the effective visual field narrow. Thus, from FIG. 11, it will be seen that the actual read time in the invention can be greatly reduced as compared with that in the prior art.

As described above, the image scanner according to the present invention has the photosensitive array formed of a row of a plurality of photosensitive elements which are exposed to light to induce accumulated charges, the shift register for receiving the stored charges from the photosensitive elements and supplying them to the output portion, the shift gate by which the stored charges in the photosensitive elements are allowed or not to be transferred to the shift register, and transfer command signal output means for producing the transfer command signal which orders the shift gate to transfer the charges stored in the photosensitive elements to the shift register. In addition, since the transfer command signal output means can generate the transfer command signal at variable intervals of time, unnecessary data can be removed in accordance with the size of the electronic component, and thus the amount of data to be processed can be greatly reduced with the result that high speed reading can be effected.

What is claimed is:

1. An image scanner comprising:
   a photosensitive element array having a plurality of photosensitive elements arranged in a primary scanning direction from a first end to a second end, for being exposed to light from an object to accumulate therein a plurality of charges respectively;
   a shift gate for receiving a transfer command signal and for receiving said plurality of charges accumulated in said plurality of photosensitive elements and simultaneously transferring said plurality of charges in response to the transfer command signal;
   a shift register for receiving said plurality of charges simultaneously transferred from said shift gate, and sequentially outputting said plurality of charges one by one, starting from one of the plurality of charges accumulated in one of the plurality of photosensitive elements which is disposed at said first end; and
   transfer command signal output means for supplying said transfer command signal to said shift gate at variable generation intervals of time in accordance with a length of said object in said primary scanning direction.

2. An image scanner according to claim 1, further comprising shading means for shading a subplurality of photosensitive elements from among said plurality of photosensitive elements, said subplurality of photosensitive elements being sequentially arranged starting from said second end of said photosensitive element array so that said subplurality of photosensitive elements are not exposed to light.

3. An image scanner according to claim 2, wherein said shading means changes a number of said subplurality of photosensitive elements to be shaded in accordance with the generation intervals of said transfer command signal.

4. An image scanner according to claim 1, wherein said shift register includes reset means for resetting said shift register after said shift register outputs a number of charges representing said object from among said plurality of charges and before said shift register receives new charges from said photosensitive element array, and thereby erasing charges remaining in said shift register.

5. An image scanner according to claim 1, further comprising:
   reset means for erasing charges remaining in said shift register from among said plurality of charges in response to said transfer command signal; and
   delay means for delaying said transfer command signal for a predetermined time to produce a delayed transfer command signal and supplying said delayed transfer command signal to said shift gate.

6. A method of scanning an image by a photosensitive element array which has a plurality of photosensitive elements arranged in a primary scanning direction from a first end to a second end, said plurality of photosensitive elements for accumulating a plurality of charges in response to said image, said method comprising:
   (a) blocking a first subplurality of photosensitive elements from among said plurality of photosensitive elements, said first subplurality of photosensitive elements being sequentially arranged starting from said second end of said photosensitive element array so that a first subplurality of charges from among said plurality of charges, said first subplurality of charges corresponding to said first subplurality of photosensitive elements, are not accumulated in said first subplurality of photosensitive elements;
   (b) exposing a second subplurality of photosensitive elements from among said plurality of photosensitive elements to light so that a second subplurality of charges from among said plurality of charges, said second subplurality of charges corresponding to said second subplurality of photosensitive elements, are accumulated in said second subplurality of photosensitive elements;
   (c) simultaneously transferring said second subplurality of charges to a shift register;
   (d) sequentially outputting said second subplurality of charges from said shift register one by one, starting from one of the second subplurality of charges in one of the second subplurality of photosensitive elements disposed at said first end; and
   (e) simultaneously transferring new charges again accumulated in said second subplurality of photosensitive elements to said shift register after all said second subplurality of charges are completely output from said shift register.

7. A method according to claim 6, wherein step (b) comprises shading said first subplurality of photosensitive elements.

8. A method according to claim 6, wherein said first and second subpluralities of photosensitive elements are mutually exclusive and together form all of said plurality of photosensitive elements.

9. A method of scanning an image by using a photosensitive element array which has a plurality of photosensitive elements arranged in a primary scanning direction from a first end to a second end, said method comprising:
   (a) exposing said plurality of photosensitive elements to light so that a plurality of charges are accumulated in said plurality of photosensitive elements respectively;
   (b) simultaneously transferring said plurality of charges accumulated in said plurality of photosensitive elements to a shift register;
   (c) sequentially outputting a first subplurality of charges from among said plurality of charges from said shift register one by one, said first subplurality of charges starting from one of the charges accumulated in one of the plurality of photosensitive elements disposed at said first end;
   (d) forcibly erasing a second subplurality of charges from among said plurality of charges remaining in said shift register after said first subplurality of charges are output from said shift register; and
   (e) simultaneously transferring new charges accumulated in said plurality of photosensitive elements to said shift register from which said second subplurality of charges have been erased.

10. A method according to claim 9, wherein said first and second subpluralities of photosensitive elements are mutually exclusive and together form all of said plurality of photosensitive elements.

* * * * *

UNITED STATES PATENT AND TRADEMARK OFFICE
CERTIFICATE OF CORRECTION

PATENT NO.    : 6,348,947 B1
DATED         : February 19, 2002
INVENTOR(S)   : Hatase It is certified that error appears in the above-identified patent and that said Letters Patent is hereby corrected as shown below:

<u>Title page,</u>
Item [*], Notice, delete "0" and insert -- 1000 --.

Signed and Sealed this

First Day of July, 2003

JAMES E. ROGAN
*Director of the United States Patent and Trademark Office*